(12) United States Patent
Lynch et al.

(10) Patent No.: US 8,810,294 B2
(45) Date of Patent: Aug. 19, 2014

(54) BALANCED AUXILIARY ON TIME GENERATOR FOR MULTIPHASE STACKABLE CONSTANT ON TIME CONTROL ARCHITECTURE

(71) Applicant: Texas Instruments Incorporated, Dallas, TX (US)

(72) Inventors: Brian Thomas Lynch, Brookline, NH (US); Joseph Maurice Khayat, Bedford, NH (US); Stefan Wlodzimierz Wiktor, Raleigh, NC (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/051,346

(22) Filed: Oct. 10, 2013

(65) Prior Publication Data
US 2014/0097881 A1    Apr. 10, 2014

Related U.S. Application Data

(60) Provisional application No. 61/712,018, filed on Oct. 10, 2012, provisional application No. 61/712,043, filed on Oct. 10, 2012, provisional application No. 61/712,053, filed on Oct. 10, 2012.

(51) Int. Cl.
*G01P 3/66* (2006.01)
*G05F 1/40* (2006.01)

(52) U.S. Cl.
USPC ............................ 327/172; 327/178; 323/288

(58) Field of Classification Search
USPC ................... 327/172–175, 178; 323/288, 282
See application file for complete search history.

(56) References Cited

U.S. PATENT DOCUMENTS

| 6,819,577 | B1 | 11/2004 | Wiktor et al. | |
|---|---|---|---|---|
| 6,828,063 | B2 * | 12/2004 | Park et al. | 429/219 |
| 6,850,045 | B2 | 2/2005 | Muratov et al. | |
| 7,045,992 | B1 * | 5/2006 | Silva et al. | 323/222 |
| 7,075,353 | B1 * | 7/2006 | Wan et al. | 327/295 |
| 7,372,240 | B2 | 5/2008 | Khayat et al. | |
| 7,705,689 | B2 | 4/2010 | Harrison et al. | |
| 7,855,903 | B2 | 12/2010 | Khayat et al. | |
| 7,903,433 | B2 | 3/2011 | Carpenter et al. | |
| 8,217,636 | B2 | 7/2012 | Khayat et al. | |

OTHER PUBLICATIONS

"A Scalable Multiphase Buck Converter With Average Current Share Bus," International Rectifier, North Kingstown, RI as presented at APEC 03, Nov. 5, 2003, pp. 1-7 (Huang, et al.).
U.S. Appl. No. 13/948,404, filed Jul. 23, 2013.

* cited by examiner

*Primary Examiner* — Dinh T. Le
(74) *Attorney, Agent, or Firm* — William B. Kempler; Frederick J. Telecky, Jr.

(57) ABSTRACT

A control circuit configured to control a switching power supply including a ramp generator configured to generate a triangular waveform. A comparator is configured to generate a series of pulse width modulated (PWM) pulses at a first frequency and to regulate the switching power supply. The ramp generator includes a capacitor, a charging current source configured to provide a charging current to charge the capacitor, and a discharging current source configured to provide a discharging current to discharge the capacitor. The ramp generator also includes a closed loop current balancing current source configured to balance the currents from the charging and discharging current sources to establish a substantially zero direct current (DC) bias across the capacitor. The controller also includes a multi-phase configuration to provide a stackable multi-channel architecture.

20 Claims, 11 Drawing Sheets

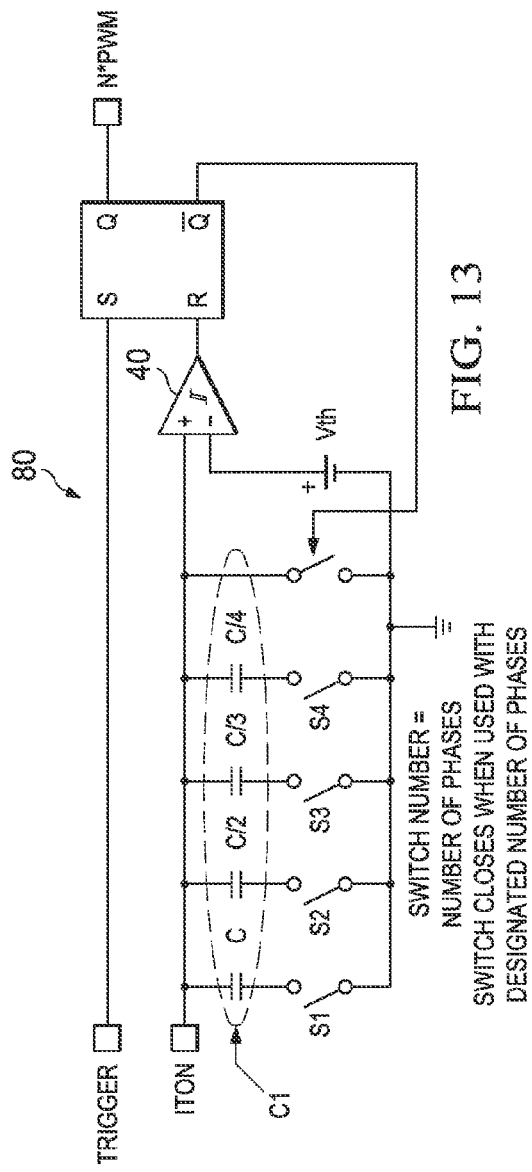
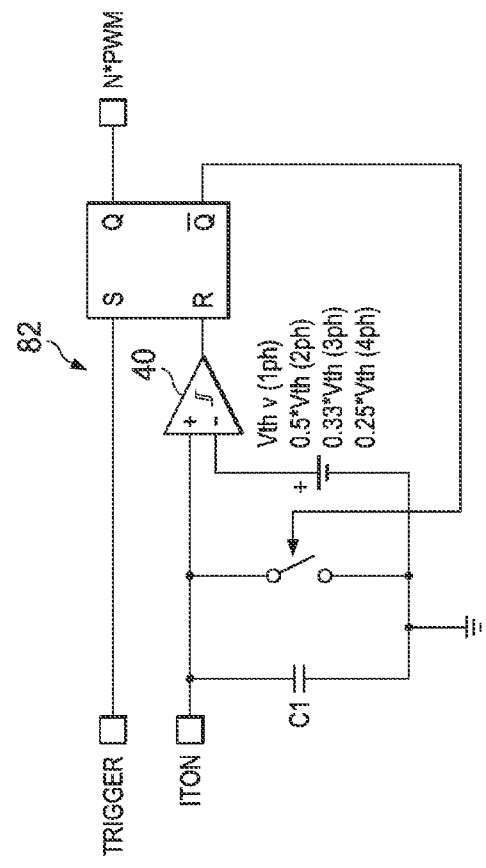
FIG. 13
FIG. 14

BALANCED AUXILIARY ON TIME GENERATOR FOR MULTIPHASE STACKABLE CONSTANT ON TIME CONTROL ARCHITECTURE

CROSS-REFERENCE TO RELATED APPLICATIONS AND PRIORITY CLAIM

This application claims priority under 35 U.S.C. §119(e) to:

U.S. Provisional Patent Application Ser. No. 61/712,018 filed on Oct. 10, 2012;

U.S. Provisional Patent Application Ser. No. 61/712,043 filed Oct. 10, 2012; and U.S. Provisional Patent Application Ser. No. 61/712,053 filed Oct. 10, 2012.

The contents of the above-identified provisional patent applications are incorporated herein by reference.

TECHNICAL FIELD

This application relates generally to analog-controlled switching power supplies and control circuits thereof.

BACKGROUND

Constant ON time control in a direct current-to-direct current (DC/DC) buck converter is well-suited for a single channel converter. This control architecture often utilizes the valley of a ripple voltage of an output filter capacitor to initiate a new pulse width modulated (PWM) pulse and does not use a fixed oscillator clock to initiate this pulse. In lieu of the output filter capacitor ripple, an emulated ripple can be used for the valley control. The emulated ripple is synchronized to the PWM pulse, meaning a TON timer ends a PWM pulse and also turns off the ripple ramp. Similarly, when the valley of the ramp crosses a reference voltage, a new PWM pulse starts.

In an analog-controlled switching power supply, accurate output voltage sensing is often necessary or desirable to maintain regulation. The output voltage of the switching power supply can include a DC average value plus some amount of AC ripple. The output voltage of the power supply is typically to be regulated at this average value.

It is sometimes desirable to, as a way of determining the "next pulse," use a triangular waveform that is compared to a control signal. This triangular waveform may be generated using a variety of methods, each method with trade-offs in performance. For example, a fixed triangular waveform in a Voltage Mode Converter provides ease of use but has variable gain with a change in input voltage.

One way to generate a triangular control waveform is to use current sources to charge and discharge a capacitor. Balancing the charge and discharge rates is typically critical in order to achieve stable control. Assume the current sources are used to charge and discharge the capacitor in a periodic fashion to generate the triangular waveform. In this case, it is likely that tolerances of the current sources and/or the timing of the turn-on or turn-off of the current sources will cause an ampere-second imbalance between the charge and discharge intervals. This results in a buildup of DC bias voltage across the capacitor. If left uncorrected, the DC bias builds to a level such that the voltage on the capacitor is no longer a periodic signal but rather becomes saturated either at the supply voltage rail or at ground.

For ramp generation, other solutions may use switches to connect and disconnect one or more resistors to and from a capacitor. This approach is limited in dynamic operating range and is susceptible to noise.

Other solutions may use current sources but require manual adjustment of the current sources or timing circuits or the addition of a resistor to "bleed" excess current from one side of the capacitor in order to maintain a zero DC bias condition. These solutions generally also have limited dynamic range.

In output ripple-controlled converters (such as Hysteretic, Constant ON time, Constant OFF time, and some fixed frequency "output ripple controlled" converters), the "decision point" for regulation (i.e. to trigger the next ON or OFF pulse to maintain the correct average energy at the converter output) is made at the peak or valley of the output voltage ripple waveform. By triggering at a peak or valley of the output voltage ripple, a "peak-to-average" error develops. In some cases, such as during a load transient, this error can cause a peak of the output voltage to exceed voltage (deviation from nominal) specifications.

In those applications where a Dual Differential Difference Amplifier (3DA) configuration is used, particularly in peak or valley detection ripple converters, current approaches typically use an external circuit to offset either the reference or sensed output voltage. This is done to level-shift the converter output voltage in order to meet a desired average value.

SUMMARY

This disclosure provides a control circuit for a switching power supply.

In a first example, a control circuit is configured to control a switching power supply having an output. The control circuit includes a ramp generator configured to generate a triangular waveform. The control circuit also includes a comparator having a first input configured to receive the triangular waveform and a second input configured to receive a first reference voltage. The comparator is also configured to generate a series of pulse width modulated (PWM) pulses at a first frequency and to regulate the switching power supply. The ramp generator includes a capacitor, a charging current source configured to provide a charging current to charge the capacitor, and a discharging current source configured to provide a discharging current to discharge the capacitor. The ramp generator comprises a capacitor, and a current source configured to provide a charging current or discharging current to the capacitor. The ramp generator further comprises a closed loop current balancing source configured to provide a charging current or discharging current to the capacitor to establish a substantially zero direct current (DC) bias across the capacitor.

In a second example, a control circuit is configured to control a switching power supply having an output. The control circuit includes a ramp generator having a capacitor configured to generate a triangular waveform. The control circuit also includes a comparator having a first input configured to receive the triangular waveform and having a second input configured to receive a first reference voltage. The comparator is configured to generate a series of pulse width modulated (PWM) pulses at a first frequency and to regulate the switching power supply. The control circuit further includes an integrator having an output configured to provide the first reference voltage to the second input of the comparator. The integrator has a first input configured to receive a second reference voltage and a second input configured to, receive a feedback signal from the output of the switching power supply.

In a third example, a control circuit is configured to control a switching power supply having an output. The control circuit includes a ramp generator having a capacitor configured to generate a triangular waveform. The control circuit also includes a comparator having a first input configured to receive the triangular waveform and having a second input configured to receive a first reference voltage. The comparator is configured to generate a series of pulse width modulated (PWM) pulses at a first frequency and to regulate the switching power supply. The control circuit further includes a multi-phase generator configured to be responsive to the comparator. The multi-phase generator is configured to generate a second series of PWM pulses at a second frequency that is a multiple of the first frequency at a same duty cycle as the triangular waveform and in phase with the triangular waveform.

Other technical features may be readily apparent o one skilled in the art from the following figures, descriptions, and claims.

BRIEF DESCRIPTION OF THE DRAWINGS

For a more complete understanding of this disclosure and its advantages, reference is now made to the following description, taken in conjunction with the accompanying drawings, in which:

FIG. 13 shows an alternative embodiment of an AUX TON generator for establishing multiple phases; and FIG. 14 shows another alternative embodiment of an AUX TON generator for establishing multiple phases.

DETAILED DESCRIPTION

FIGS. 1 through 14, discussed below, and the various examples used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Figure 1:
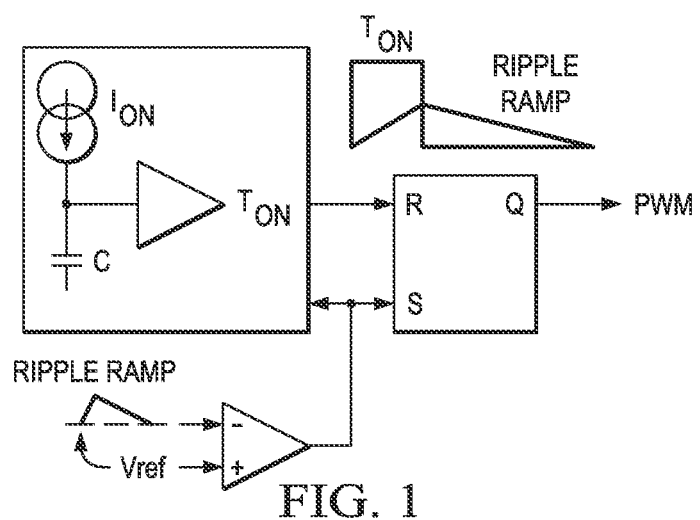
FIG. 1 illustrates a conventional constant ON time controller for a switching power supply.

FIG. 1 illustrates a conventional constant ON time controller for a switching power supply. When a new pulse width modulated (PWM) pulse is commanded, a TON timer is initiated, such as by using a current source Ion and a capacitor C. The charge time is set to precisely align to the natural loop expected TON as dictated by TON=VOUT/VIN*Ts, where $T_S$ represents the total switching period. At the end of the charge time, the PWM pulse is turned off, and the ripple ramp discharges. The ripple ramp is often derived from the capacitor's equivalent series resistance (ESR) voltage ripple or a sensed inductor ripple current. When the ripple ramp valley meets a reference voltage $V_{REF}$, a new PWM pulse is commanded. The ripple ramp charges again, and the process is repeated.

Figure 2A:
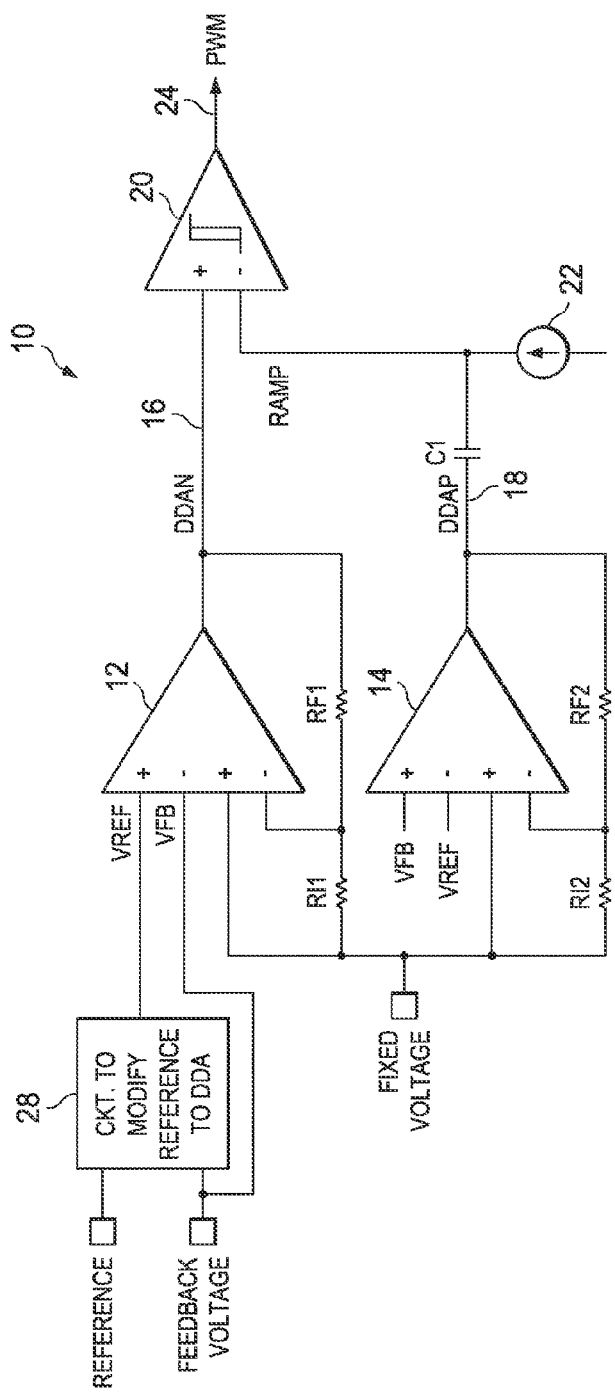
FIGS. 2A and 2B illustrate a conventional analog control circuit for a switching power supply that can develop a DC bias.
Figure 2B:
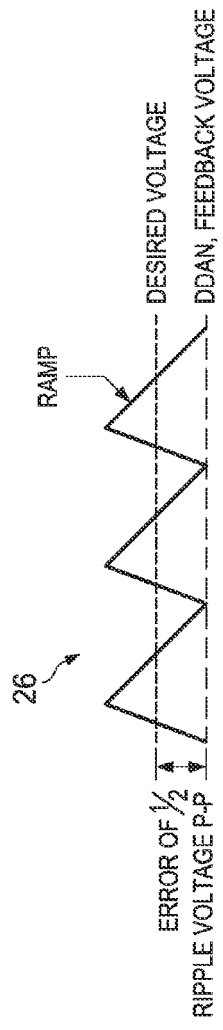

FIGS. 2A and 2B illustrate a conventional analog control circuit for a switching power supply that can develop a DC bias. In particular, FIG. 2A illustrates an analog-controlled switching power supply controller 10 according to a conventional approach that can develop a DC bias at a converter output, which is reflected as a difference between a reference voltage $V_{REF}$ and a feedback voltage $V_{FB}$. The controller 10 includes a pair of four-input amplifiers 12 and 14 having respective outputs 16 and 18 configured as inputs to a comparator 20. A charging capacitor C1 is coupled between the output 18 and the inverting input of the comparator 20. A current source 22 charges and discharges the capacitor C1 to generate a ripple ramp triangular waveform on the inverting input of the comparator 22, which create a series of PWM pulses at an output 24 of the comparator 22. This constant ON time controller 10 uses "valley detection" of the output voltage ripple for operation and regulation. This "valley detection" creates an error on the sensed output voltage of one-half of the peak-to-peak value of the output voltage ripple as shown in FIG. 2B, which is the difference between the desired converter output voltage and the feedback voltage.

In FIG. 2A, a circuit 28 may represent an amplifier with an averaging circuit to average the sensed converter output voltage. The circuit 28 may then adjust the reference voltage $V_{REF}$ as sent to the amplifier 12 in order to shift the converter output voltage to the desired value. Another implementation may instead modify the feedback signal from the converter output to create an offset, which again corrects the output voltage to the desired average value. In either case, the circuit 28 adds an additional loop compensation element (generally of a low-pass nature) to the system, which adds complexity and some performance limitations to the feedback loop design.

Figure 3A:
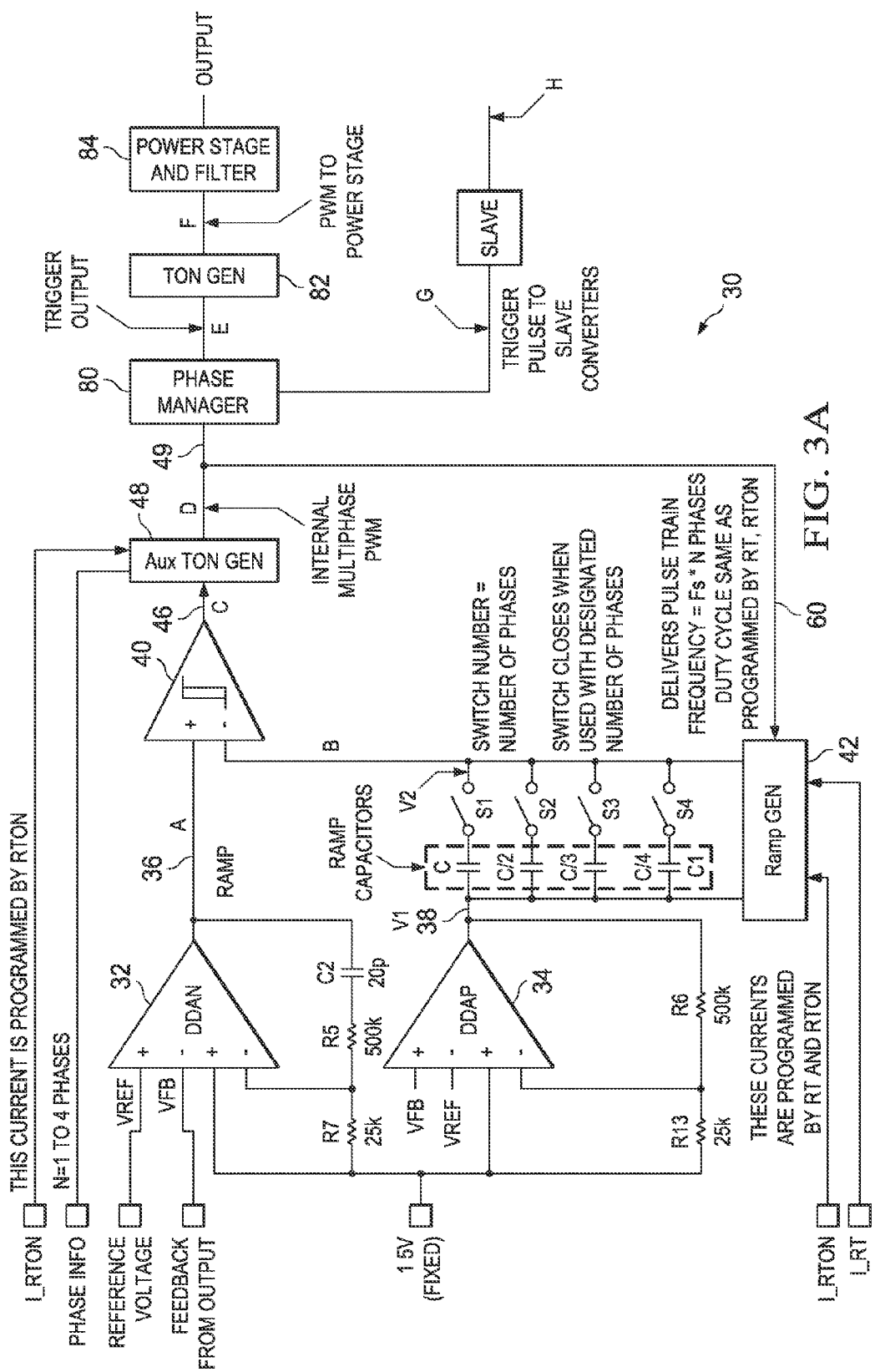
FIGS. 3A, 3B and 3C illustrate an example analog control circuit for a switching power supply according to one embodiment of this disclosure.
Figure 3B:
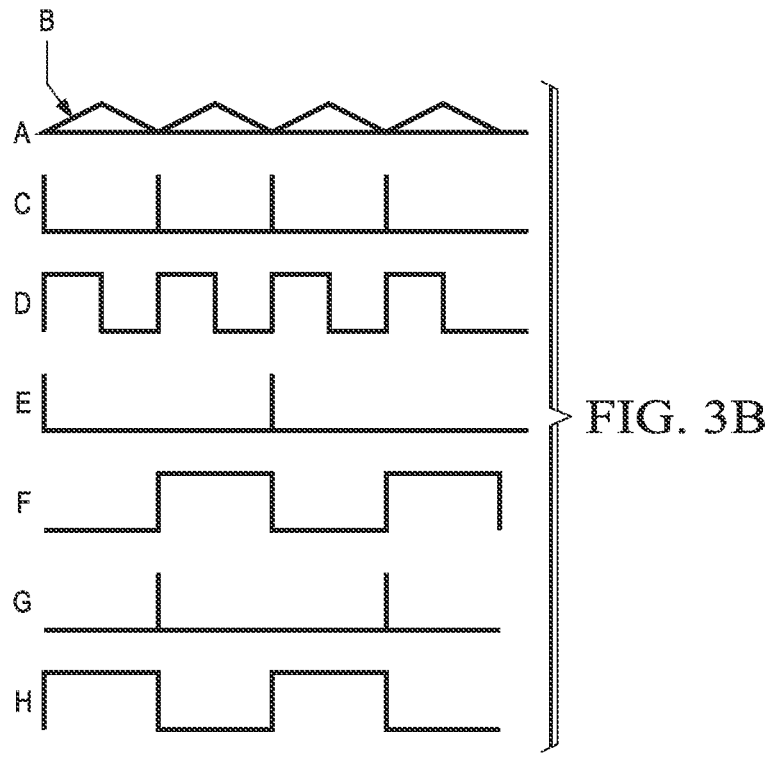

FIGS. 3A and 3B illustrate an example analog control circuit for a switching power supply according to one embodiment of this disclosure. In particular, FIG. 3A illustrates an analog-controlled switching power supply controller 30. The controller 30 includes a pair of four-input amplifiers 32 and 34 having respective outputs 36 and 38 configured as inputs to a comparator 40. A charging capacitor C1 is coupled between the output 38 of the amplifier 34 and the inverting input of the comparator 40. In this embodiment, capacitor C1 is comprised of a bank of four capacitors in parallel having capacitances C, C/2, C/3 and C/4, each capacitor having an associated switch S1, S2, S3 and S4, respectively, configured to selective establish one of these capacitors between output 38 and comparator 40 to establish multiple phases, as will be described in more detail shortly. The charging capacitor C1 is controllably charged and discharged by a ramp generator circuit 42 to generate a ripple ramp triangular waveform 44.

The comparator 40 compares the output of the amplifier 32 to the triangular waveform 44 in order to generate a series of trigger pulses at an output 46 and the input of Aux TON generator 48, as shown in waveform diagram FIG. 3B wherein waveforms A-H correspond to signals at nodes A-H, respectively, which will be described in more detail shortly.

According to one aspect of this disclosure, the four input amplifier 32 is configured as an integrator by inserting a feedback capacitor C2 into the feedback loop with a feedback resistor R5 coupled to a first inverting input. A resistor R7 is coupled to the first inverting input on one end, and to a first non-inverting input and a fixed reference voltage, such as 1.5V, and functions as a bias resistor. The amplifier 32 (configured as an integrator) therefore operates as an error amplifier and advantageously performs control for regulation of the converter output voltage. The amplifier 32 averages the controller output voltage provided as feedback signal FB to the second inverting input, and regulates the sensed voltage $V_{REF}$ provided directly to the second non-inverting input without the penalty created by additional circuitry (such as circuit 28 in FIG. 2A). For instance, the amplifier 32 avoids the complexity of output voltage stability versus high frequency performance, as well as the complexity associated with additional pins, external components, and internal circuit blocks. In addition, the amplifier 32 achieves a large DC gain with a nominal amount of high frequency gain. The amplifier 32 averages the output voltage at the high switching frequency and thereby helps to ensure proper average output voltage sensing.

Figure 3C:
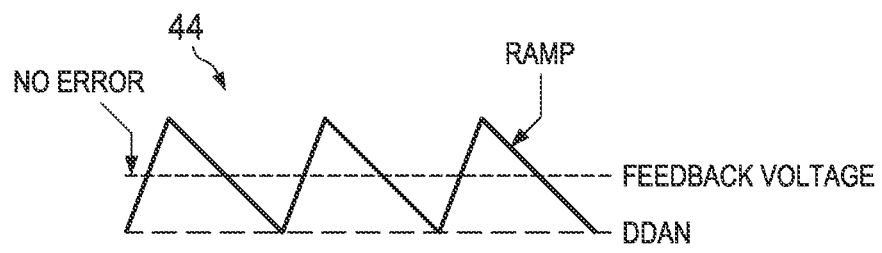

The amplifier 34, with its feedback signal FB and voltage reference $V_{REF}$ inputs inverted compared to the amplifier 32, serves to provide a large signal path to improve load transient response, mitigating the effects on the system of low high frequency gain of the amplifier 32. The amplifier 34 is configured as a non-inverting fixed-gain amplifier having a gain established by two resistors R6 and R13 and serves to bias one side of the ramp capacitor C1 at a nominal operating point, such as 1.5V, of the amplifier 32. Advantageously, no error is created at the converter output as the reference voltage $V_{REF}$ and the feedback voltage $V_{FB}$ are the same as shown in FIG. 3C.

Figure 4:
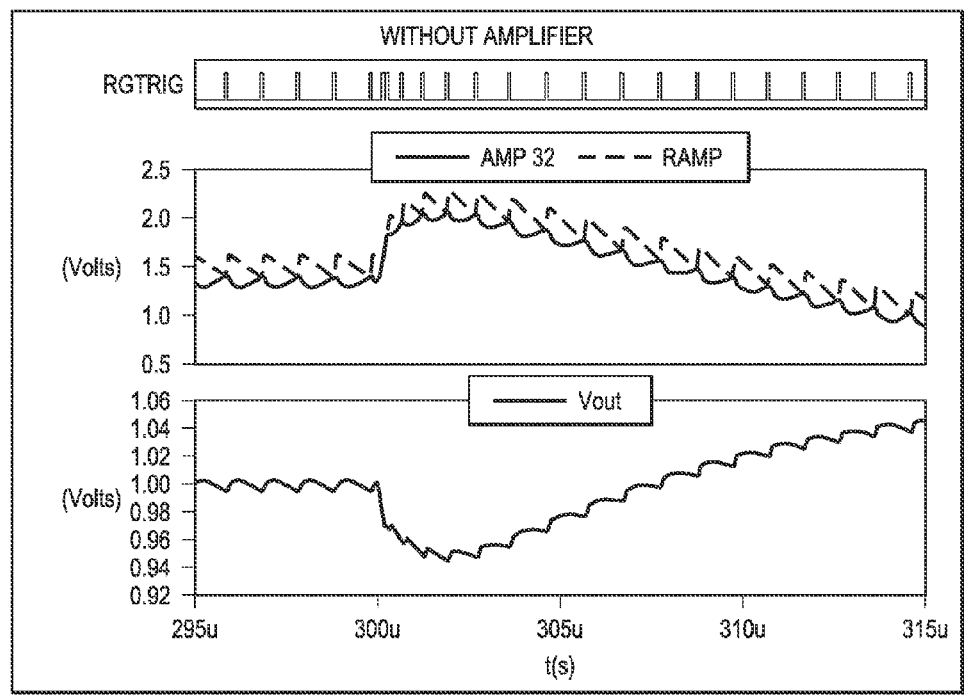
FIGS. 4 and 5 illustrate example outputs of 3DA amplifiers during a large load deviation when an output voltage droops.
Figure 5:
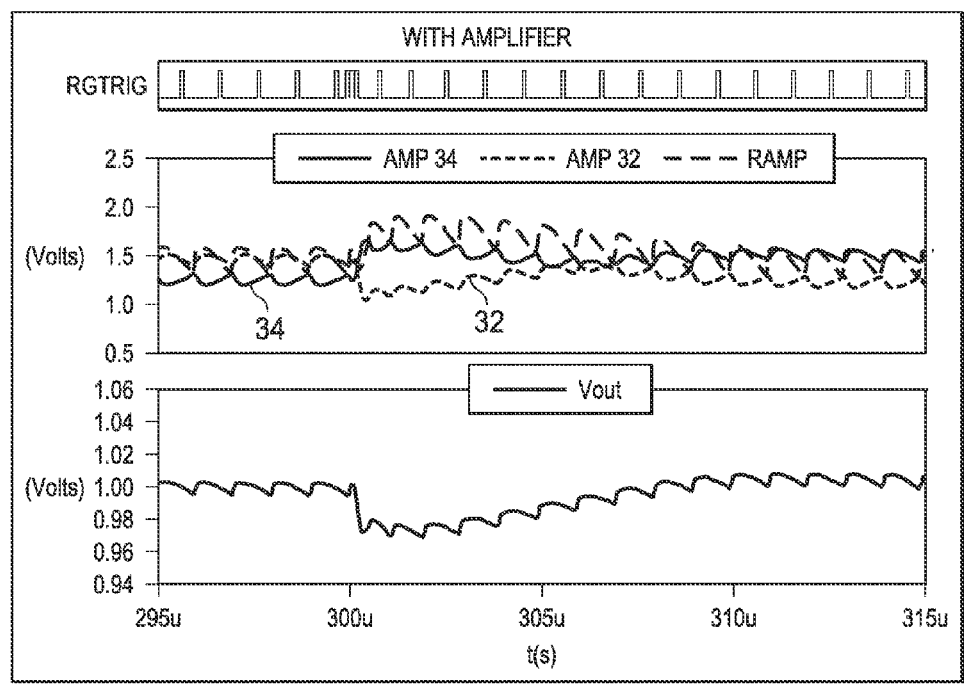

FIGS. 4 and 5 illustrate example outputs of 3DA amplifiers during a large load deviation when an output voltage droops. As shown in FIG. 4, during a large load deviation when the output voltage droops, the output of the amplifier 32 increases in voltage and drives towards an earlier trigger point on the ramp. This earlier trigger point results in a shortened discharge time of the triangular ramp waveform, and thus the DC average of the triangular waveform increases the ramp voltage away from the output voltage of the amplifier 32. Left uncorrected, the bias level shifting of the ramp waveform, combined with the limited slew rate of the amplifier 32, would result in relatively poor load transient response.

Instead, as shown in FIG. 5, during the load transient, the output of the amplifier 34, and thus the DC reference point of the ramp capacitor C1, moves in the opposite direction as the output of the amplifier 32. This counters the DC level shift of the ramp node, increasing the effective gain during the transient event and reducing the output voltage undershoot.

Figure 6:
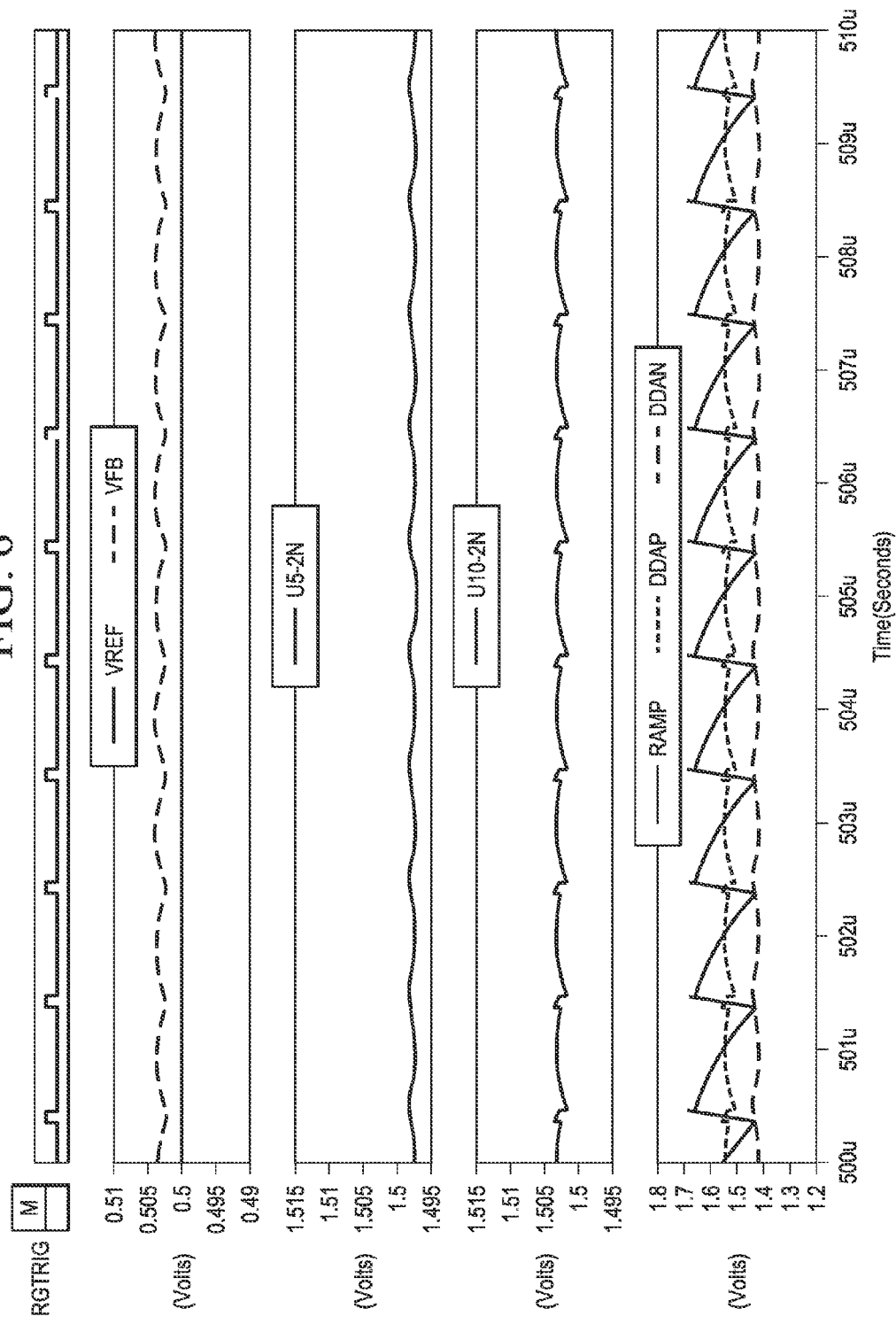
FIG. 6 illustrates an example waveform diagram of the circuit of FIG. 2A developing a DC bias.

FIG. 6 illustrates an example waveform diagram of the circuit 10 of FIG. 2A developing a DC bias. The upper waveforms in FIG. 6 illustrate a comparison of $V_{REF}$ and $V_{FB}$ with the upper amplifier 12 configured as shown in FIG. 2A, depicting an undesired voltage error between these two signals.

Figure 7:
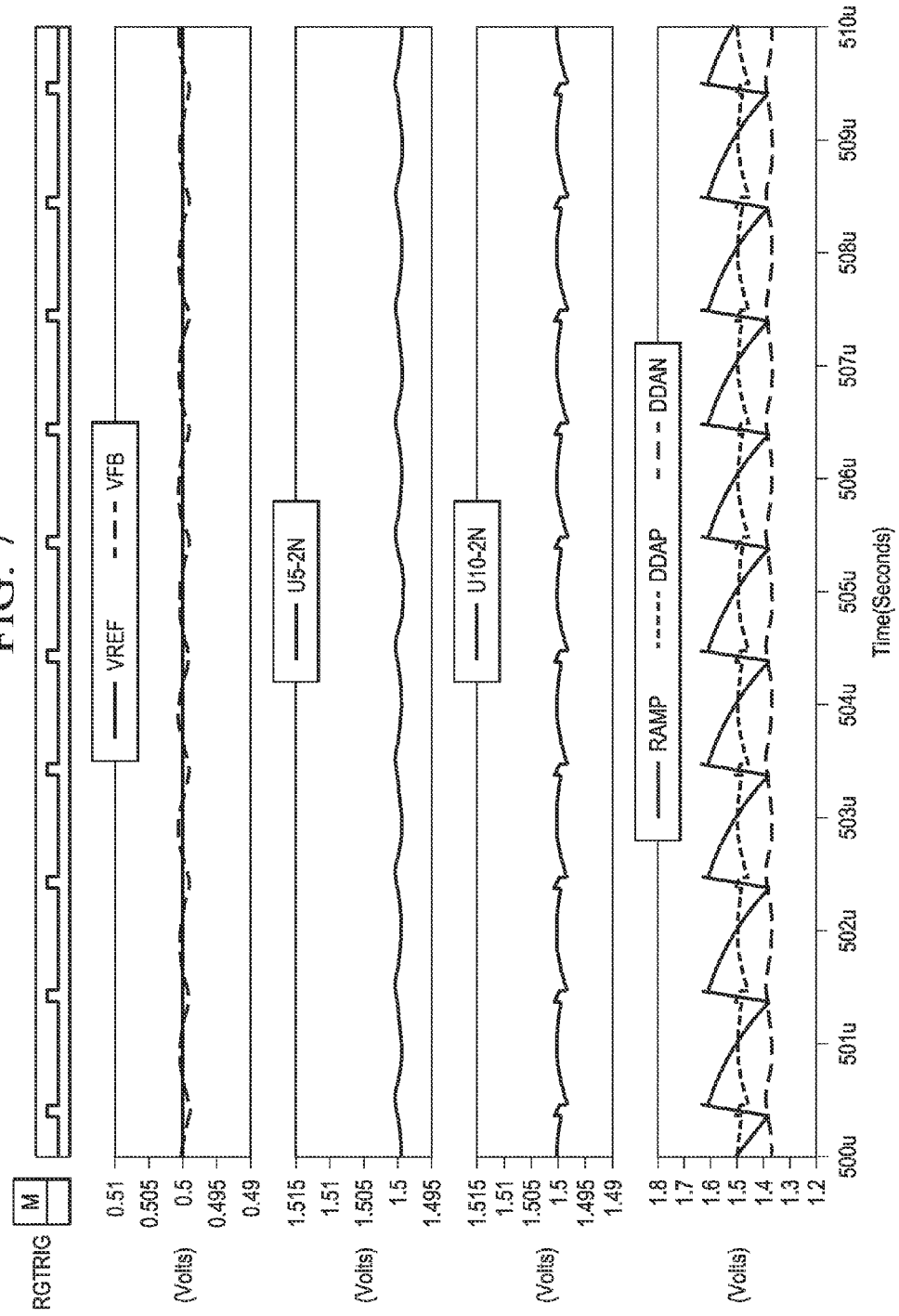
FIG. 7 illustrates an example waveform diagram of the circuit of FIG. 3A eliminating any DC bias.

FIG. 7 illustrates an example waveform diagram of the circuit 30 of FIG. 3A eliminating any DC bias. As noted above, the amplifier 32 is configured as an integrator, and FIG. 7 shows the elimination of the voltage error between $V_{REF}$ and $V_{FB}$.

Figure 8:
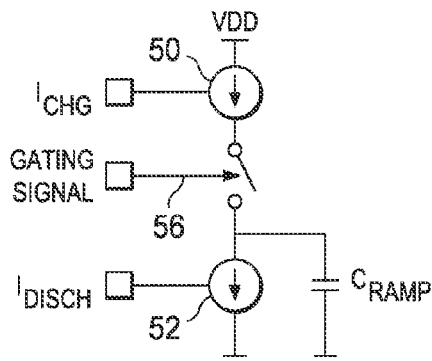
FIG. 8 illustrates a conventional ramp generator circuit using current sources to charge and discharge a capacitor.

FIG. 8 illustrates a conventional open loop ramp generator circuit using current sources to charge and discharge a capacitor. The ramp generator circuit can be used to create the ripple ramp triangular waveform at the inverting input of the comparator 40. A current source 50 provides a charging current to charge a capacitor $C_{RAMP}$, and a discharging current source 52 is in parallel with the capacitor $C_{RAMP}$ to discharge the capacitor $C_{RAMP}$. The charging and discharging current sources 50 and 52 are programmable by respective control signals $I_{CHG}$ and $I_{DISCH}$.

Figure 9:
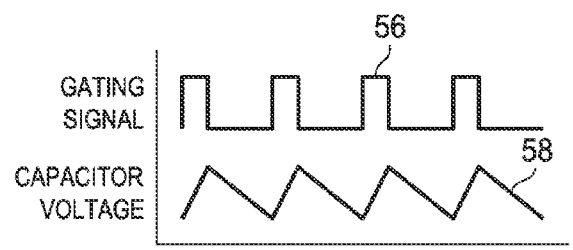
FIG. 9 illustrates an example waveform diagram of the ramp generator circuit of FIG. 8.

FIG. 9 illustrates an example waveform diagram of the ramp generator circuit of FIG. 8. As shown here, a gating signal 56 controls the on time of the charging current source 50 to create the ripple ramp triangular waveform 58 across the capacitor $C_{RAMP}$. This approach can create a DC bias across the capacitor $C_{RAMP}$ and the converter output.

Figure 10A:
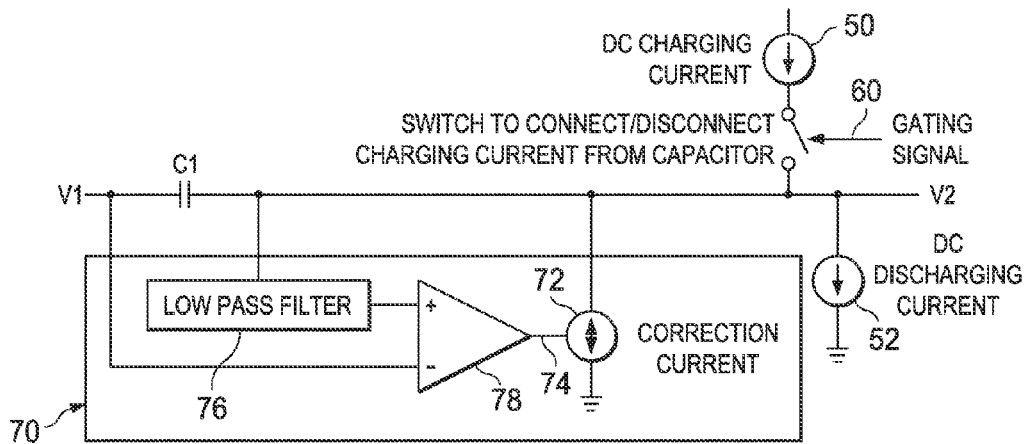
FIGS. 10A, 10B and 10C illustrates an example correction circuit that balances the current sources of FIG. 8 according to one embodiment of this disclosure.

FIG. 10A illustrates a first example of a closed loop correction circuit 70 that balances current sources 50 and 52 to maintain zero DC bias across capacitor C1 according to one embodiment of this disclosure. As shown here, the ramp generator 42 advantageously develops the ripple ramp triangular waveform 44 at the inverting input of the comparator 40 by programming charge current into the capacitor C1 by sequentially triggering current source 50 on, where discharge current source 52 is constantly on. Current source 50 is greater that discharge current source 52 to maintain balance. With proper sequential triggering of the current source 50 by a gating signal 60, the ripple ramp triangular waveform 44 is developed and imposed on the capacitor C1 as shown in FIG. 3B. The charging and discharging currents can be established as follows:

$$V_0(t) = \frac{I_{CHG} * t}{C}\Big|_0^{ton}$$

$$\frac{I_{DISCHG} * t}{C}\Big|_{ton}^{T_S}$$

Here, ton represents the ON time of a PWM pulse, $T_S$ represents the total switching period, and C represents the capacitance of the capacitor C1.

Depending on the implementation, example advantages of this approach can include the following. First, the triangular waveform 44 is representative of an inductor current waveform without sensing of the current. This gives some advantage in feedback loop control and noise immunity and saves an interconnect pin. Second, the waveform generating current sources 50 and 52 may be programmed via resistor selection or by digital or analog programming of the current sources. Third, the current sources 50 and 52 may be manipulated to scale with some outside parameter, giving great flexibility and adaptability to outside influences over a very wide operating range of input voltage, output voltage, and operating frequency. Fourth, the triangular waveform 44 is programmable in slope as well as amplitude, allowing additional versatility in application. For example, in a multi-phase converter, the triangular waveform 44 could emulate the combined currents in each phase's inductor without the need for direct sensing. A multi-phase application is discussed below with reference to FIG. 11.

The charging current source 50 is gated on and off by the gating signal 60 as shown in FIG. 3A. The gating signal 60 can pulse high when the next "ON" pulse is commanded by the feedback loop. In this case, the ON time of the current source 50 can be programmed by resistor selection, where:

$$I_{CHG} = \frac{v_{in} * F_s * k2}{v_{out}}$$

Here, $V_{in}$ represents the input voltage, $V_{out}$ represents the converter output voltage, $F_s$ represents the switching frequency, and k2 is a constant derived from other (fixed) circuit elements.

The discharging current source 52 can be programmed by a resistor to represent the switching period of the converter, where:

$$I_{DISCHG} = k1 * F_s$$

where Fs represents the converter switching frequency, and k1 represents a constant derived from other (fixed) circuit elements.

Still referring to FIG. 10A, to solve the problem of DC bias build-up on the capacitor C1, a current balancing control circuit 70 having a closed loop "correction" or current balancing source 72 is placed in parallel with one of the other current sources 50 or 52 to return ampere-second balance or "zero DC bias" to the capacitor C1 and avoid DC drift. The current balancing source 72 is shown in parallel with the discharging current source 52, although it could be in parallel with the charging current source 50 if desired. Control of this third current balancing source 72 is provided through a feedback path from each side of the capacitor C1 to generate a control signal 74, which (with appropriate filtering and gain) can be used to control the amplitude of the third current balancing source 72. In this way, a steady-state balanced condition exists despite external influences to imbalance the system, and a linear circuit is maintained. Note that this third current balancing source 72 may be bi-directional in that it may source or sink current.

In the circuit shown in FIG. 10A, V1 is the voltage provided by the amplifier 34 as shown in FIG. 3A. Through use of the current sources 50-52 and appropriate switch timing, voltage V2 is the triangular waveform 44 "floating" on voltage V1. Voltage V2 is low-pass filtered by a filter 76 to create a close-to-DC voltage. The filtered voltage V2 is compared to voltage V1 via an amplifier 78 to generate the control signal 74, and the correction current generated by the current balancing source 72 represents current added to, or subtracted from, the V2 node to satisfy the goal of the filtered voltage V2 equaling the voltage V1.

Figure 10B:
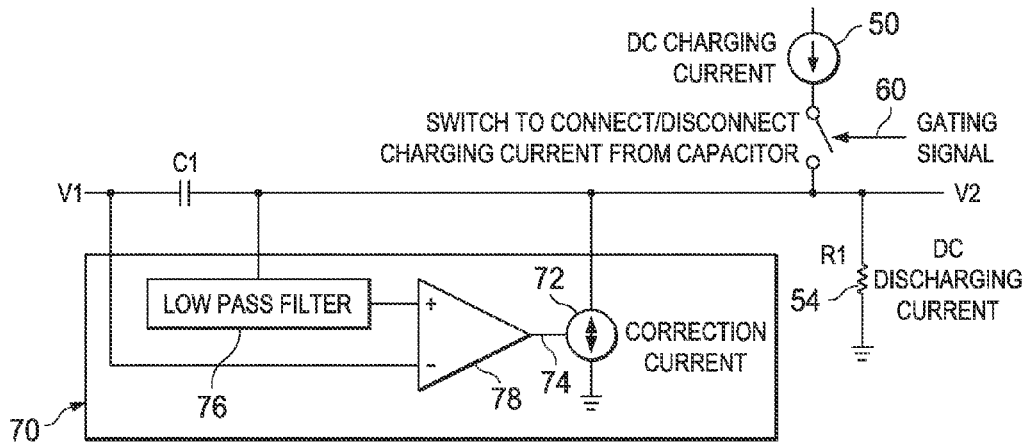
Figure 10C:
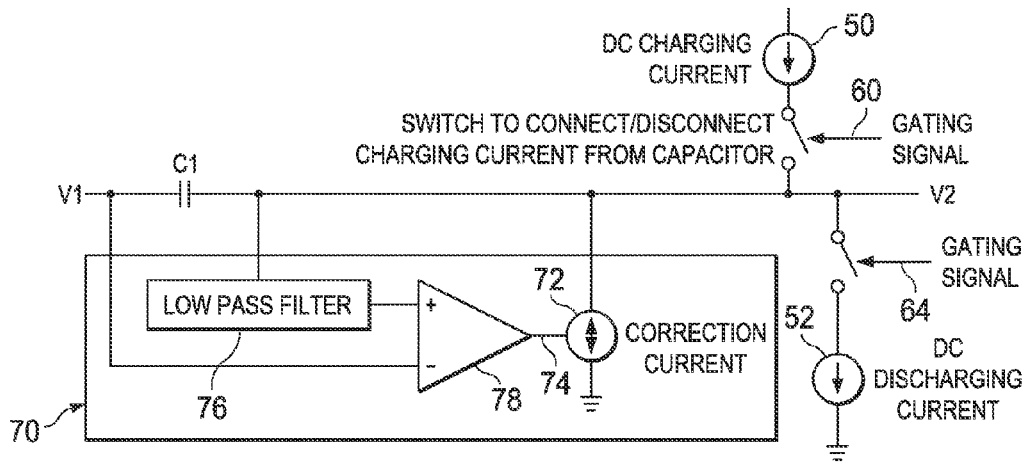

Note that the circuit 70 in FIG. 10A represents one implementation of a closed loop correcting current circuit, and other suitable current balancing control circuits having a closed loop "correction" current balancing source to return ampere-second balance or "zero DC bias" to the capacitor C1 may be used. FIG. 10B shows one such alternative embodiment wherein the discharging current source 52 is replaced with a resistor R1 providing a current discharging path. This discharging resistor R1 is coupled between capacitor C1 and discharges capacitor C1. Current source 50 selectively charges the capacitor C1 as a function of the gating signal 60 to return ampere-second balance or "zero DC bias" to the capacitor C1. FIG. 10C shows yet another example whereby both the charging current source 50 and the discharging current source 52 are selectively controlled by gating signal 60 and a gating signal 62, respectively, whereby the gating signals 60 and 62 maintain zero DC bias across capacitor C1.

Therefore, a minimum of only one charging or discharging current source is required, along with a closed loop correcting current balance source.

This solution provides a simple way of programming the triangular waveform 44 using a number of methods, and it provides consistent operation over a wide dynamic operating range of input voltage, output voltage, and switching converter frequency without tradeoffs. It is also generally immune from noise generated by the switching power supply. This solution also provides a way to self-correct for current source tolerance changes or drift in the timing of the gating signal(s). The amount of correction current provided allows the circuit to be used in applications requiring a large dynamic operating range without external (user) adjustment.

Referring now back to FIG. 3A, the circuit 30 is further provided with a phase manager 80 receiving the trigger pulses 60 from the Aux TON timer 48. Phase manager 80 provides trigger pulses to TON generator 82, which in turn provides PWM pulses to a power stage and filter 84. The phase manager 80 also provides the trigger pulses to a plurality of slave circuits 86, whereby the signaling of each stage is shown in FIG. 3B. Advantageously, the pulse width of the Aux TON timer 48 has the same duty cycle as the output generated by the comparator 40, helping to ensure that the timing is correct for regulation.

Figure 11:
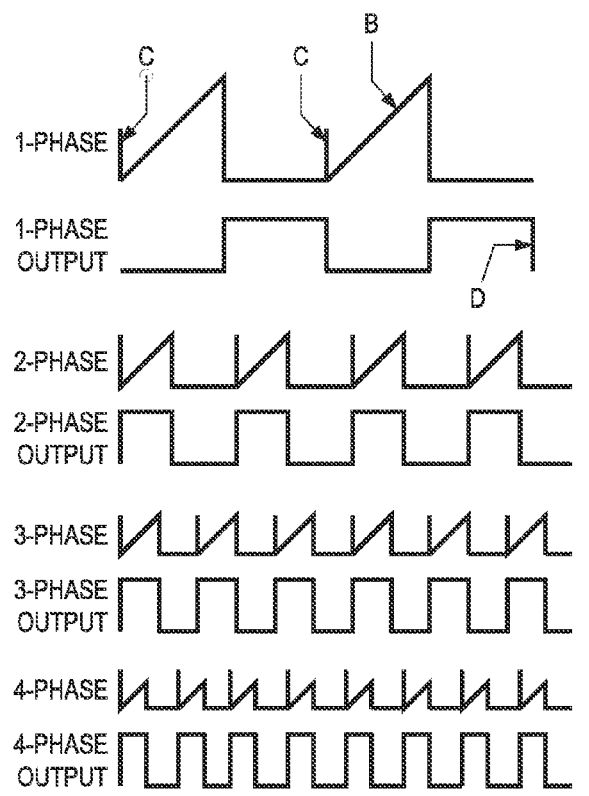
FIG. 11 illustrates multi-phase ripple ramps having the same duty cycle enabling a stackable multi-channel architecture according to one embodiment of this disclosure.
Figure 12:
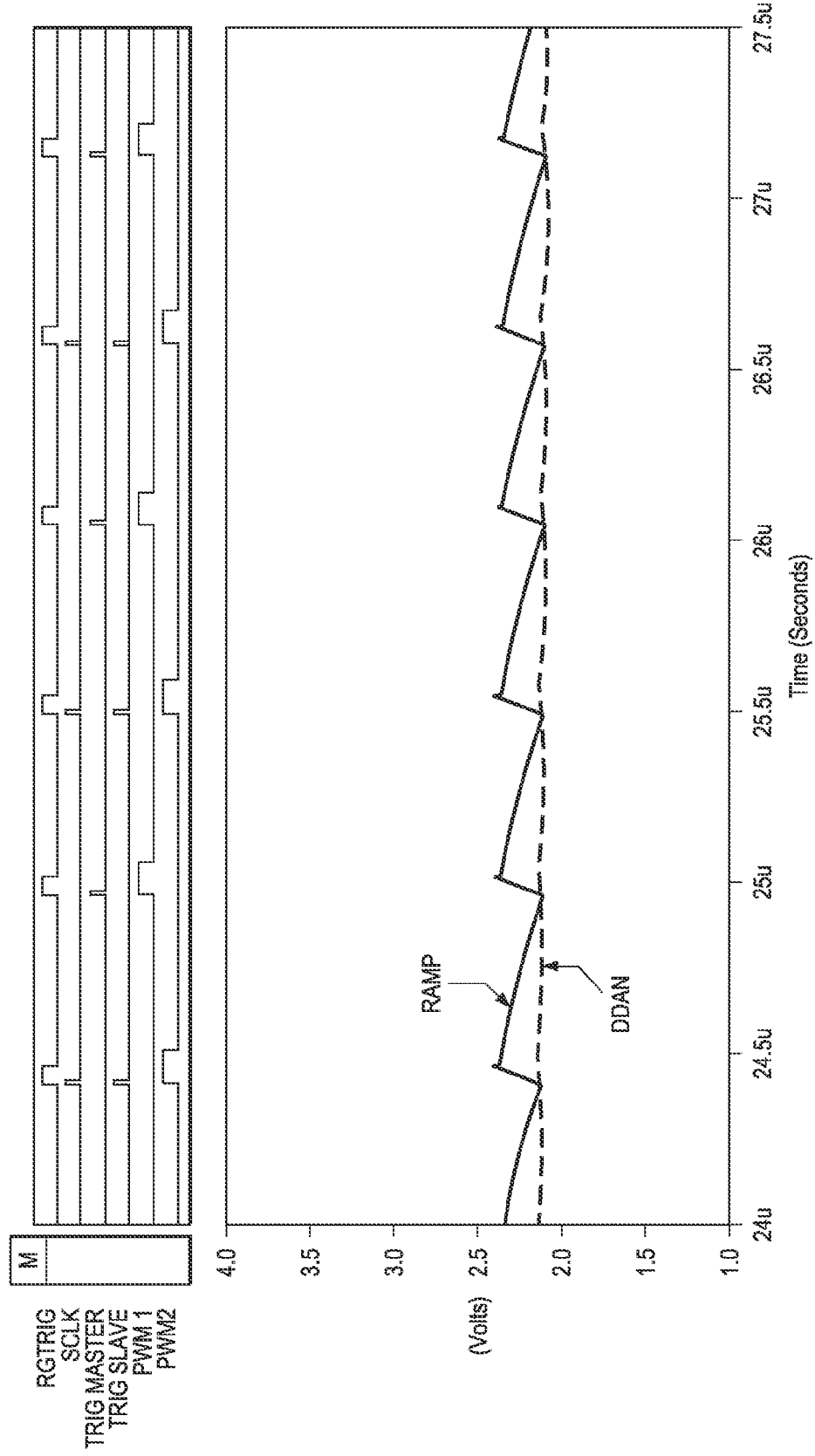
FIG. 12 illustrates a waveform diagram of a two channel multi-phase generator according to one embodiment of this disclosure.

In one embodiment, the Aux TON timer 48 is configured to receive a programming phase signal IRTON for selecting the number of phases in the system. The phase signal IRTON programs the voltage threshold in the Aux TON timer 48, with the result being the PWM pulse train comprising gating signal 60 has the same duty cycle as that programmed into the converter, but at a frequency multiple of the pulses generated by the comparator 40 as shown in FIG. 11. For example, the voltage threshold is Vth for one phase, and 0.5*Vth for 2 phases, 0.33*Vth for 3 phases, and 0.25*Vth for 4 phases. This enables a stackable multi-channel architecture, where N*Freq PWM pulses are generated to drive the multiple converter channels at equal phase division, due to the absence of a synchronization clock, where N is the number of channels as shown in FIG. 11 and FIG. 12.

This aspect of the disclosure addresses the challenges of stacking multiple constant ON time converters in a multi-phased configuration by embedding the second Aux TON timer 48, referred to as a Balanced Auxiliary Ton timer. The term "balance" implies that the Aux TON timer 48 has the same duty cycle as the primary loop PWM provided by TON generator 82, but is configured to run at N*Freq of the main single channel loop. Matching the volt-second balance of the loop in the Aux TON timer 48 is done to achieve system stability over a wide range of LC filters. In addition, the Aux TON timer 48 synchronizes an emulated modulator ripple ramp whose charge rate is derived from the charge rate of the Aux TON timer 48.

This aspect of this disclosure embellishes the known constant ON time control and incorporates a novel method to generate multiple valley trigger pulses that maintain the same volt-second balance as the primary loop trigger pulse. The ON time of the Aux TON timer 48 is an N-fraction of the primary loop TON timer. That is, the primary loop TON timer is:

$$TON = v_{out}/v_{in} * T_s$$

where $T_s$ represents the switching period. The Aux timer value then becomes:

$$TONAUX = TON/N$$

where N represents the number of channels (and where N=1, 2, 3, 4, . . . in a possible multi-phase configuration).

In tandem with the Aux TON generator 48, the emulated ripple ramp derives its charging rate similar to the Aux TON of the system. That is, the charge rate of the ripple ramp is N times the charge rate of the main loop TON timer. In doing so to the ripple ramp, its peak-to-peak value can remain substantially constant, which helps to ensure a stable system while operating over a wide range of LC filter combinations. Since the charging rate in units of "volt/second" is "i/c" (where "i" is the charge current and "c" is the capacitor), N*charge rate can be accomplished either by increasing "i" as in "N*i" or decreasing "c" as in "c/N".

Note here that the ripple ramp is derived using the current sources 50 and 52 and the capacitor C1. As shown in FIG. 3A, capacitor C1 is comprised of a bank of capacitors having capacitances C, C/2, C/3 and C/4, whereby the switches S1-S4 control which capacitance is used for capacitor C1 to thus control the ramp charging rate. Changes in the current sources 50 or 52, or in the capacitance C1 due to process variations, can reflect similarly to both the ripple ramp 44 and the Aux TON timer 48, thus keeping them tracked to one another.

FIG. 13 shows another embodiment of a programmable Aux TON generator 48 at 80.

Both the N-factored Aux TON timer 80 and the N-factored ripple ramp perform valley detection that runs at N*Freq. Rather than simply operating at N*Freq, this helps to ensure that the Aux TON timer ON time is an N-fraction of the primary loop On time. As a result, the Aux TON and ripple ramp run at substantially the same volt-second balance and duty cycle as the primary loop. Furthermore, the ripple ramp peak-to-peak can be maintained similarly going from one channel to multiple channels, helping to ensure a stable modulator gain that helps achieve a system that accommodates a wide operating LC filter range without making a gain adjustment.

FIG. 14 shows another embodiment of a programmable Aux TON generator 48 at 82.

The comparator voltage reference provided to the inverting input of the comparator 40 is selected depending on the number of phases. A single phase, for example, has the highest reference voltage Vth, thus the longest time required for the capacitor C1 to charge and trip the comparator 40. When selecting a two-phase system, the reference voltage is cut in half, thus 0.5Vth. Hence, the charge time of the capacitor C1 is reduced by half, allowing the Aux TON generator 82 to produce two cycles in the same time period of a single phase. As a result, the frequency is doubled. The comparator reference voltage is reduced to 0.33Vth for three phases, and is reduced to 0.25Vth for four phases.

Although the figures have illustrated different circuits and operational examples, various changes may be made to the figures. For example, the circuits shown in FIG. 3A and FIGS. 10A-10C illustrate particular implementations of a switching power supply controller 30 and a correction circuit 70. Other implementations can use other circuit components to achieve the same or similar functionality.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A control circuit configured to control a switching power supply having an output, the control circuit comprising:
    a ramp generator configured to generate a triangular waveform;
    a comparator having a first input configured to receive the triangular waveform and a second input configured to receive a first reference voltage, the comparator configured to generate a series of pulse width modulated (PWM) pulses at a first frequency and to regulate the switching power supply;
    wherein the ramp generator comprises a capacitor, and a current source configured to provide a charging current or discharging current to the capacitor; and
    wherein the ramp generator further comprises a closed loop current balancing source configured to provide the charging current or the discharging current to the capacitor to establish a substantially zero direct current (DC) bias across the capacitor.

2. The control circuit as specified in claim 1, wherein the current balancing source is configured to reduce DC bias at the capacitor.

3. The control circuit as specified in claim 1, wherein the ramp generator comprises a controller configured to sequentially trigger the current source on and off.

4. The control circuit as specified in claim 1, wherein the current source is one of a charging current source and a discharging current source, and the current balancing source is coupled in parallel with current source.

5. The control circuit as specified in claim 1, wherein the current source comprises both a charging current source and a discharging current source, wherein the current balancing source is controllably coupled in parallel with one of the charging current source and the discharging current source.

6. The control circuit as specified in claim 1, further comprising:
    an amplifier having a first input coupled to a first side of the capacitor and a second input coupled to a second side of the capacitor, the amplifier configured to control the current balancing source.

7. The control circuit as specified in claim 6, further comprising a low-pass filter coupled to the second input and configured to create a close-to-DC voltage in order to control the current balancing source.

8. The control circuit as specified in claim 6, wherein:
    the first input of the amplifier is an inverting input coupled to the first side of the capacitor; and
    the second input of the amplifier is a non-inverting input coupled via a low-pass filter to the second side of the capacitor.

9. The control circuit as specified in claim 1, further comprising:

an integrator having an output configured to provide the first reference voltage to the second input of the comparator, the integrator having a first input configured to receive a second reference voltage and a second input configured to receive a feedback signal from the output of the switching power supply.

10. The control circuit as specified in claim 9, further comprising:
an amplifier having a first input configured to receive the second reference voltage and a second input configured to receive the feedback signal, the amplifier having an output coupled to the first input of the comparator and configured to counter a DC level shift at the second input of the comparator during a load transient event.

11. The control circuit as specified in claim 1, further comprising:
a multi-phase generator configured to be responsive to the comparator, the multi-phase generator configured to generate a second series of PWM pulses at a second frequency that is a multiple of the first frequency and at a same duty cycle as the triangular waveform and in phase with the triangular waveform;
wherein the control circuit comprises a TON timer, and the multi-phase generator comprises an auxiliary TON timer configured to generate the second series of PWM pulses, where TON represents the ON time of the PWM pulses.

12. The control circuit as specified in claim 11, wherein the second frequency is programmable.

13. A control circuit configured to control a switching power supply having an output, the control circuit comprising:
a ramp generator comprising a capacitor configured to generate a triangular waveform;
a comparator having a first input configured to receive the triangular waveform and having a second input configured to receive a first reference voltage, the comparator configured to generate a series of pulse width modulated (PWM) pulses at a first frequency and to regulate the switching power supply; and
an integrator having an output configured to provide the first reference voltage to the second input of the comparator, the integrator having a first input configured to receive a second reference voltage and a second input configured to receive a feedback signal from the output of the switching power supply.

14. The control circuit as specified in claim 13, further comprising:
an amplifier having a first input configured to receive the second reference voltage and a second input configured to receive the feedback signal, the amplifier configured to counter a direct current (DC) level shift at the second input of the comparator during a load transient event.

15. The control circuit as specified in claim 14, wherein the amplifier is configured to provide a large signal path to improve a load transient response and mitigate any effects created by a low high frequency gain of the comparator.

16. A control circuit configured to control a switching power supply having an output, the control circuit comprising:
a ramp generator comprising a charging capacitor configured to generate a triangular waveform;
a comparator having a first input configured to receive the triangular waveform and having a second input configured to receive a first reference voltage, the comparator configured to generate a first series of pulse width modulated (PWM) pulses at a first frequency and to regulate the switching power supply; and
a multi-phase generator configured to be responsive to the comparator, the multi-phase generator configured to generate a second series of PWM pulses at a second frequency that is a multiple of the first frequency and at a same duty cycle as the triangular waveform and in phase with the triangular waveform.

17. The control circuit as specified in claim 16, wherein the second frequency is programmable.

18. The control circuit as specified in claim 16, wherein the control circuit comprises a TON timer, and the multi-phase generator comprises an auxiliary TON timer configured to generate the second series of PWM pulses.

19. The control circuit as specified in claim 16 wherein the multi-phase generator comprises a set of capacitors whereby one of the capacitors in the set of capacitors is configured to be selectively established as the charging capacitor to establish the second frequency.

20. The control circuit as specified in claim 16 wherein the first reference voltage is programmable and is configured to establish the second frequency.

* * * * *